United States Patent
Weingarten et al.

(10) Patent No.: US 8,458,574 B2
(45) Date of Patent: Jun. 4, 2013

(54) COMPACT CHIEN-SEARCH BASED DECODING APPARATUS AND METHOD

(75) Inventors: Hanan Weingarten, Herzelia (IL); Ofir Avraham Kanter, Yokneam Ilit (IL); Avi Steiner, Kiryat Motzkin (IL); Erez Sabbag, Kiryat Bialik (IL)

(73) Assignee: Densbits Technologies Ltd., Haifa (IL)

( * ) Notice: Subject to any disclaimer, the term of this patent is extended or adjusted under 35 U.S.C. 154(b) by 981 days.

(21) Appl. No.: 12/509,748

(22) Filed: Jul. 27, 2009

(65) Prior Publication Data

US 2010/0257433 A1 Oct. 7, 2010

Related U.S. Application Data

(60) Provisional application No. 61/166,834, filed on Apr. 6, 2009.

(51) Int. Cl.
*H03M 13/00* (2006.01)

(52) U.S. Cl.
USPC ........... 714/781; 714/752; 714/782; 714/784; 714/785

(58) Field of Classification Search
None
See application file for complete search history.

(56) References Cited

U.S. PATENT DOCUMENTS

| | | |
|---|---|---|
| 4,463,375 A | 7/1984 | Macovski |
| 4,584,686 A | 4/1986 | Fritze |
| 4,589,084 A | 5/1986 | Fling et al. |
| 4,866,716 A | 9/1989 | Weng |
| 5,077,737 A | 12/1991 | Leger et al. |
| 5,297,153 A | 3/1994 | Baggen et al. |
| 5,657,332 A | 8/1997 | Auclair et al. |
| 5,729,490 A | 3/1998 | Calligaro et al. |
| 5,793,774 A | 8/1998 | Usui et al. |
| 5,926,409 A | 7/1999 | Engh et al. |
| 5,942,005 A * | 8/1999 | Hassner et al. ............... 714/784 |
| 5,956,268 A | 9/1999 | Lee |
| 5,974,582 A * | 10/1999 | Ly .................................. 714/781 |
| 5,982,659 A | 11/1999 | Irrinki et al. |
| 6,038,634 A | 3/2000 | Ji et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |

(Continued)

OTHER PUBLICATIONS

Fedorenko, S.V.; Trifonov, P.V.; , "Finding roots of polynomials over finite fields," Communications, IEEE Transactions on , vol. 50, No. 11, pp. 1709-1711, Nov. 2002, doi: 10.1109/TCOMM.2002. 805269.*

(Continued)

*Primary Examiner* — Albert Decady
*Assistant Examiner* — Justin R Knapp
(74) *Attorney, Agent, or Firm* — Dentons US LLP

(57) ABSTRACT

A method and an apparatus that has Chien search capabilities, the apparatus includes a first hardware circuit and a second hardware circuit. The first hardware circuit evaluates an error locator polynomial for a first element of a finite field over which the error locator polynomial is defined to provide a first set of intermediate results and a first Chien search result and provides the first set of intermediate results to the second hardware circuit; the second hardware circuit evaluates the error locator polynomial for a second element of the finite field to provide a second Chien search result in response to the first set of intermediate results. The first hardware circuit may be substantially bigger than the second hardware circuit and the first element may differ from the second element.

20 Claims, 13 Drawing Sheets

U.S. PATENT DOCUMENTS

| | | |
|---|---|---|
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,581,180 B1* | 6/2003 | Weng ........................ 714/781 |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,447,982 B1* | 11/2008 | Thurston ........................ 714/785 |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 2001/0037483 A1* | 11/2001 | Sankaran et al. .............. 714/782 |
| 2001/0052103 A1* | 12/2001 | Hirofuji et al. ................ 714/781 |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0140303 A1* | 7/2003 | Litwin et al. ................... 714/785 |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0172208 A1* | 8/2005 | Yoon ........................ 714/784 |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Sokolov et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0168335 A1* | 7/2008 | Mead ........................ 714/784 |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2008/0320371 A1* | 12/2008 | Hsu ........................ 714/784 |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |

| | | | |
|---|---|---|---|
| 2009/0157964 A1 | 6/2009 | Kasorla et al. | |
| 2009/0158126 A1 | 6/2009 | Perlmutter et al. | |
| 2009/0168524 A1 | 7/2009 | Golov et al. | |
| 2009/0187803 A1 | 7/2009 | Anholt et al. | |
| 2009/0199074 A1 | 8/2009 | Sommer | |
| 2009/0213653 A1 | 8/2009 | Perlmutter et al. | |
| 2009/0213654 A1 | 8/2009 | Perlmutter et al. | |
| 2009/0228761 A1 | 9/2009 | Perlmutter et al. | |
| 2009/0240872 A1 | 9/2009 | Perlmutter et al. | |
| 2009/0292976 A1* | 11/2009 | Kikuchi et al. | 714/784 |
| 2010/0005270 A1 | 1/2010 | Jiang | |
| 2010/0058146 A1 | 3/2010 | Weingarten et al. | |
| 2010/0064096 A1 | 3/2010 | Weingarten et al. | |
| 2010/0088557 A1 | 4/2010 | Weingarten et al. | |
| 2010/0091535 A1 | 4/2010 | Sommer et al. | |
| 2010/0095186 A1 | 4/2010 | Weingarten | |
| 2010/0110787 A1 | 5/2010 | Shalvi et al. | |
| 2010/0115376 A1 | 5/2010 | Shalvi et al. | |
| 2010/0122113 A1 | 5/2010 | Weingarten et al. | |
| 2010/0124088 A1 | 5/2010 | Shalvi et al. | |
| 2010/0131580 A1 | 5/2010 | Kanter et al. | |
| 2010/0131806 A1 | 5/2010 | Weingarten et al. | |
| 2010/0131809 A1 | 5/2010 | Katz | |
| 2010/0131826 A1 | 5/2010 | Shalvi et al. | |
| 2010/0131827 A1 | 5/2010 | Sokolov et al. | |
| 2010/0131831 A1 | 5/2010 | Weingarten et al. | |
| 2010/0146191 A1 | 6/2010 | Katz | |
| 2010/0146192 A1 | 6/2010 | Weingarten et al. | |
| 2010/0149881 A1 | 6/2010 | Lee et al. | |
| 2010/0180073 A1 | 7/2010 | Weingarten et al. | |
| 2010/0199149 A1 | 8/2010 | Weingarten et al. | |
| 2010/0199154 A1* | 8/2010 | Wu et al. | 714/784 |
| 2010/0211724 A1 | 8/2010 | Weingarten | |
| 2010/0211833 A1 | 8/2010 | Weingarten | |
| 2010/0211856 A1 | 8/2010 | Weingarten | |
| 2010/0251066 A1 | 9/2010 | Radke | |
| 2010/0253555 A1 | 10/2010 | Weingarten et al. | |
| 2010/0257309 A1 | 10/2010 | Barsky et al. | |
| 2010/0293321 A1 | 11/2010 | Weingarten | |
| 2011/0047441 A1* | 2/2011 | Yamaga | 714/773 |
| 2011/0051521 A1 | 3/2011 | Levy et al. | |
| 2011/0055461 A1 | 3/2011 | Steiner et al. | |
| 2011/0096612 A1 | 4/2011 | Steiner et al. | |
| 2011/0119562 A1 | 5/2011 | Steiner et al. | |
| 2011/0153919 A1 | 6/2011 | Sabbag | |
| 2011/0161775 A1 | 6/2011 | Weingarten | |
| 2011/0214029 A1 | 9/2011 | Steiner et al. | |
| 2011/0214039 A1 | 9/2011 | Steiner et al. | |
| 2011/0246792 A1 | 10/2011 | Weingarten | |
| 2011/0246852 A1 | 10/2011 | Sabbag | |
| 2011/0252187 A1 | 10/2011 | Segal et al. | |
| 2011/0252188 A1 | 10/2011 | Weingarten | |
| 2011/0271043 A1 | 11/2011 | Segal et al. | |
| 2011/0302428 A1 | 12/2011 | Weingarten | |
| 2012/0001778 A1 | 1/2012 | Steiner et al. | |
| 2012/0005554 A1 | 1/2012 | Steiner et al. | |
| 2012/0005558 A1 | 1/2012 | Steiner et al. | |
| 2012/0005560 A1 | 1/2012 | Steiner et al. | |
| 2012/0008401 A1 | 1/2012 | Katz et al. | |
| 2012/0008414 A1 | 1/2012 | Katz et al. | |
| 2012/0051144 A1 | 3/2012 | Weingarten et al. | |
| 2012/0063227 A1 | 3/2012 | Weingarten et al. | |
| 2012/0066441 A1 | 3/2012 | Weingarten | |
| 2012/0110250 A1 | 5/2012 | Sabbag et al. | |

OTHER PUBLICATIONS

Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Serge! Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A Scarpa, J. Dijkstra, W. Stidl, F. Kuper, "Data retention prediction for modern floating gate nonvolatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

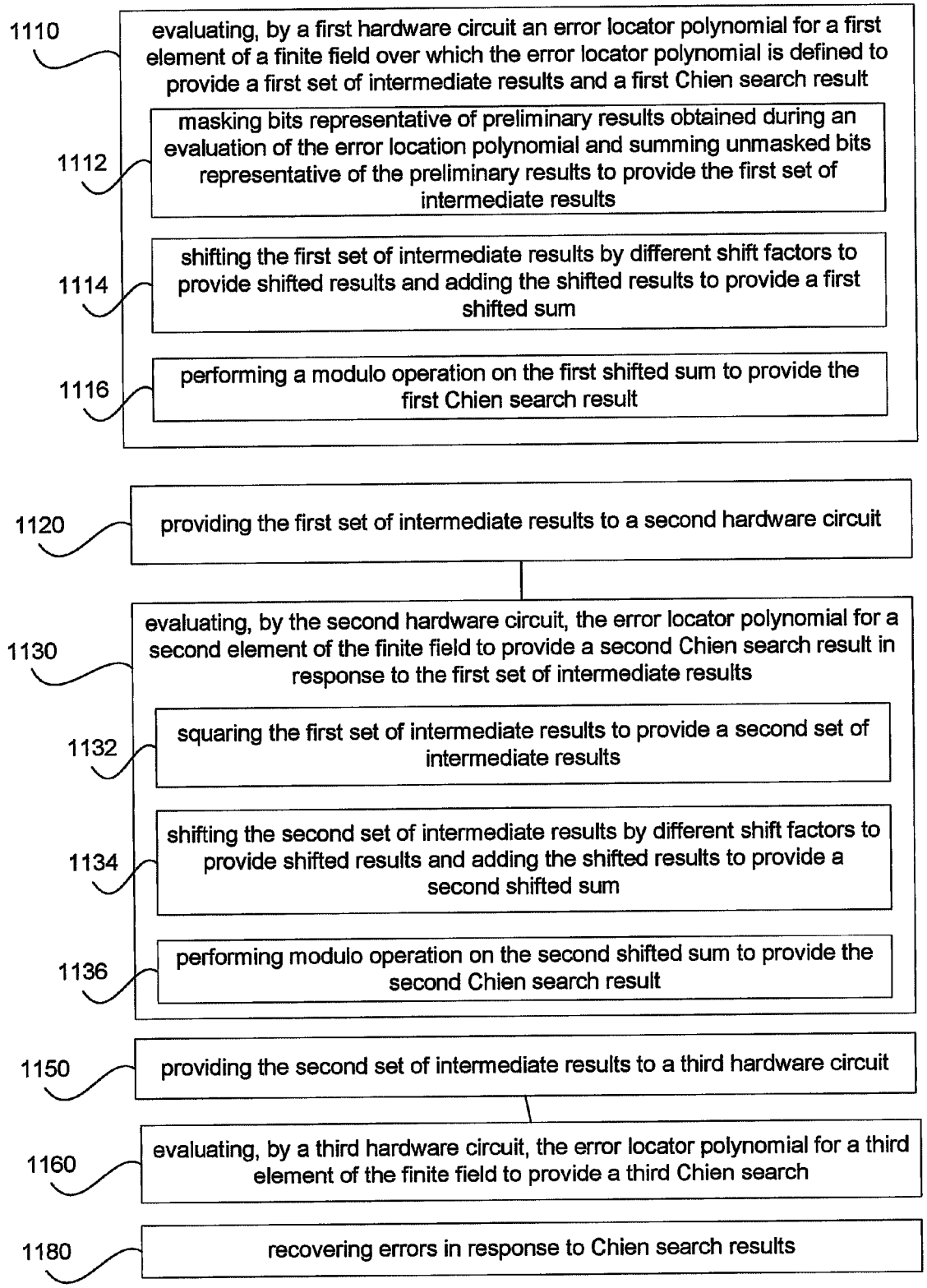
FIG. 11    1100

COMPACT CHIEN-SEARCH BASED DECODING APPARATUS AND METHOD

REFERENCE TO RELATED APPLICATIONS

This application claims the benefit of U.S. Provisional Patent Application No. 61/166,834, filed Apr. 6, 2009, the entire contents of which are incorporated herein by reference.

FIELD OF THE INVENTION

The present invention relates to a compact Chien based decoding apparatus and method.

BACKGROUND OF THE INVENTION

The term "Chien search" is used herein to refer to any typically iterative method or apparatus for determining roots of polynomials defined over a finite field. The term is also used herein to refer to any method or apparatus used for finding the roots of error-locator polynomials encountered in decoding, e.g., Reed-Solomon codes and BCH codes in various applications including but not limited to flash memory and other data storage applications, and data communications applications.

The error locator polynomial (denoted $\Lambda$) has the following format:

$$\Lambda(x) = \Lambda_0 + \Lambda_1 \ast x + \Lambda_2 \ast x^2 + \ldots + \Lambda_t \ast x^t \qquad \text{(Equation 1)}$$

The Chien search includes evaluating the error locator polynomial for multiple elements of a Galois field $GF(2^m)$ over which the error locator polynomial is defined. The elements are powers of the primitive element in the field, alpha ($\alpha$).

Accordingly, the Chien search includes evaluating the error locator polynomial for various powers of alpha, by setting powers of alphas in equation 1 the following sets of equations are obtained:

$$\Lambda(\alpha) = \Lambda_0 + \Lambda_1 \ast \alpha + \Lambda_2 \ast \alpha^2 + \ldots + \Lambda_t \ast \alpha^t$$

$$\Lambda(\alpha^2) = \Lambda_0 + \Lambda_1 \ast \alpha^2 + \Lambda_2 \ast \alpha^4 + \ldots + \Lambda_t \ast \alpha^{2t}$$

$$\Lambda(\alpha^m) = \Lambda_0 + \Lambda_1 \ast \alpha^m + \Lambda_2 \ast \alpha^{2m} + \ldots + \Lambda_t \ast \alpha^{mt}$$

The different powers of $\alpha$ are all elements in a finite field (such as a Galois field) over which the error locator polynomial is defined. Any power of alpha for which the above error locator polynomial is zero, is termed a root. These roots provide an indication about the location of the error in the received or read data. In other words, if $\alpha^n$ is a root of the error locator polynomial then if binary BCH code is being used, an error has occurred in bit n of the data being read or received. In BCH, each error is a flipped bit. In Reed-Solomon, each error is a symbol in which at least one bit is wrong.

The evaluation of the error locator polynomial can be implemented in an iterative manner by a hardware circuit 10 that is illustrated in FIG. 1. Hardware circuit 10 includes: (i) a group of registers 12(1)-12(t) that are initially fed with the coefficients ($\Lambda_1, \Lambda_2 \ldots \Lambda_t$) of the error locator polynomial, (ii) a group of Galois multipliers 14(1)-14(t) that multiply a previous content of registers 12(1)-12(t) by various powers of alpha ($\alpha, \alpha^2, \ldots \alpha^t$) to provide preliminary results that are written to the registers and are also provided to an adder, (iii) a Galois adder 16 that adds the preliminary results to provide a Chien search result. During each iteration a previous content of the k'th register is multiplied by $\alpha^k$. A content of the k'th register is denoted $\lambda_k$, the m'th bit of that register is denoted $\lambda_{k,m}$. If the Chien search result equals to minus one (or plus one for a binary field) then a root is found. (It is noted that if the Chien search result equals to zero than a root is found, when considering $\Lambda_0$ which always equals to 1.

The evaluation of the error locator polynomial can also be evaluated in parallel by a hardware circuit 20 that is illustrated in FIG. 2A. Hardware circuit 20 includes: (i) a group of registers 12(1)-12(t) that are initially fed with the coefficients ($\Lambda_1, \Lambda_2 \ldots, \Lambda_t$), (ii) multiple groups of Galois multipliers 14(1,1) … 14(1,t) … 14(p,1) … 14(p,t) that multiply a previous content of registers 12(1)-12(t) by various powers of alpha ($\alpha, \alpha_2, \ldots \alpha^t$) to provide preliminary results that are provided to Galois adders, wherein Galois multipliers of different groups of Galois multipliers can receive different powers of alpha; wherein the preliminary results of one group of Galois multipliers are written to registers 12(1)-12(t), (iii) a group of Galois adders 16(1)-16(p)—each group of Galois multipliers is connected to a dedicated Galois adder that provides a Chien search result. Accordingly, hardware circuit 20 provides p Chien search results per iteration. The parallel hardware that is described in FIG. 2A can be also implemented in a variant way, as described in FIG. 2B. In this parallel architecture all the multipliers 14(1,1) … 14(p,1) are all connected to the same register 12(1). In the same way all the multipliers 14(1,t) … 14(p,t) are all connected to the same register 12(t).

It is noted that elements of a Galois field $GF(p^n)$ can be represented as polynomials of degree strictly less than n over $GF(p)$. Operations are then performed modulo R where R is an irreducible polynomial of degree n over $GF(p)$, for instance using polynomial long division.

The constant multipliers 14(1,1) … 14(p,1) includes a modulo R operation (R is an irreducible polynomial of degree n over $GF(p)$).

Referring back to the examples set forth in FIG. 1, FIG. 2A and FIG. 2B, the Galois multipliers and Galois adders include many logic gates. The number of gates in Galois multipliers and Galois adders can be responsive to the number of bits n in the variables that are being added to each other or multiplied with each other. The number of gates in Galois multipliers, and specifically in constant multipliers (multipliers that one of the multiplicand is a constant) can be responsive to the irreducible polynomial. In addition, the number of gates in Galois constant multipliers can be responsive to the number of set bits ('1') in the powers of a as well as their location.

For example, an adder that adds two n-bit numbers in the Galois field is about 2-bit XOR gates. Even more gates are required to implement Galois adder 16 that adds J n-bit numbers. Another example is that constant multiplier which its constant multiplicand is 101010101010101 (15 bits) consume much more gates than a constant multiplier which its constant multiplicand is 000000000001111 (15 bits). The second constant multiplicand has less set bits (1), and the sets bits are located in the LSB (Least Significant Bit).

Yet for another example, FIG. 3 illustrates an area consumed by sixty six groups of four Galois constant multipliers each, wherein each Galois constant multiplier performs a multiplication between two n-bits number in the Galois field. Graph 20 illustrates the number of set bits in coefficients ($\alpha, \alpha^2, \ldots, \alpha^t$), the x-axis represents the power of alphas, and graph 30 illustrates the area consumed by the Galois multipliers. It is apparent that there is a correlation between the number of set bits in the coefficients ($\alpha, \alpha^2, \ldots, \alpha^t$) and the area consumed by the respective Galois multiplier.

There is a growing need to provide a compact Chien search based decoding apparatus and method.

SUMMARY OF EMBODIMENTS OF THE INVENTION

BCH and RS (Reed-Solomon) are among the most widely used cyclic error correcting codes. They are used in various practical fields such as storage and communication. When these coding schemes are used in mobile applications, power consumption is a major design constraint which sometimes even affects the actual viability of the applicability of the schemes to the mobile applications.

At least the decoding functionality of the above codes may typically employ a Chien search. An objective of certain embodiments of the present invention is to provide low power and low area Chien search apparatus with no impact on its performance (throughput or latency). This apparatus may be useful in a variety of applications, including, for example, mobile applications, memory applications including flash memory applications, and other suitable applications.

An apparatus according to embodiments of the present invention is provided having Chien search capabilities and including a first hardware circuit and a second hardware circuit. The first hardware circuit evaluates an error locator polynomial for a first element of a finite field over which the error locator polynomial is defined to provide a first set of intermediate results and a first Chien search result and provides the first set of intermediate results to the second hardware circuit. The second hardware circuit evaluates the error locator polynomial for a second element of the finite field to provide a second Chien search result in response to the first set of intermediate results. The first hardware circuit may be different from the second hardware circuit. For example, the first hardware circuit may be substantially larger (consume more area) than the second hardware circuit. The first and second hardware circuits can be tailored to evaluate different elements—the first element may differ from the second element.

The first hardware circuit may include a mask and add unit to sum unmasked bits representative of preliminary results obtained during an evaluation of the error locator polynomial thereby to provide the first set of intermediate results.

The first hardware circuit may include a shift and add unit to shift the first set of intermediate results by different shift factors thereby to provide shifted results and to add the shifted results to provide a first shifted sum.

The first hardware circuit may include a modulo circuit that may perform modulo operation on the first shifter sum thereby to provide the first Chien search result.

The second hardware circuit may include a squaring circuit to square the first set of intermediate results thereby to provide a second set of intermediate results.

The second hardware circuit may include a shift and add unit to shift the second set of intermediate results by different shift factors thereby to provide shifted results and to add the shifted results thereby to provide a second shifted sum.

The second hardware circuit may include a modulo circuit to perform a modulo operation on the second shifted sum thereby to provide the second Chien search result.

The apparatus according to embodiments of the present invention may include more than two hardware circuits. For example, the apparatus may include a third hardware circuit to evaluate the error locator polynomial for a third element of the finite field thereby to provide a third Chien search result in response to a second set of intermediate results generated by the second hardware circuit. It will be recognized that in some embodiments of the invention, the first hardware circuit may be different from the third hardware circuit. For example, the first hardware circuit may be substantially larger than the third hardware circuit; and wherein the third element differs from the second element and from the first element.

It will be recognized that each error locator polynomial evaluates the error locator polynomial for a different element of the finite field, an apparatus according to embodiments of the invention may include multiple hardware circuits, wherein each of the multiple hardware circuits performs a modulo operation only at a modulo circuit that provides a Chien search result. In some embodiments of the invention, each of these hardware circuits may include a mask and add unit to sum unmasked bits representative of preliminary results obtained during an evaluation of the error location polynomial.

The apparatus according to embodiments of the invention may include a recovery circuit to recover errors in response to Chien search results.

The apparatus according to embodiments of the invention may include a flash memory that stores data encoded in accordance with a Reed-Solomon decoding algorithm and wherein the stored data is Reed-Solomon decoded by a decoder that comprises at least the first and second hardware circuits.

The apparatus according to embodiments of the invention may include a flash memory to store data encoded in accordance with a BCH encoding algorithm and a BCH decoder.

A method according to embodiments of the present invention for Chien search is provided. According to some embodiments of the invention, the method may include evaluating, by a first hardware circuit an error locator polynomial for a first element of a finite field over which the error locator polynomial is defined to provide a first set of intermediate results and a first Chien search result; providing the first set of intermediate results to a second hardware circuit; and evaluating, by the second hardware circuit, the error locator polynomial for a second element of the finite field to provide a second Chien search result in response to the first set of intermediate results, wherein the first hardware circuit may be substantially larger than the second hardware circuit and wherein the first element differs from the second element.

The method according to embodiments of the invention may include masking bits representative of preliminary results obtained during an evaluation of the error location polynomial; and summing unmasked bits representative of the preliminary results to provide the first set of intermediate results.

The method according to embodiments of the invention may include shifting the first set of intermediate results by different shift factors to provide shifted results; and adding the shifted results to provide a first shifted sum.

The method according to embodiments of the invention may include performing a modulo operation on the first shifted sum to provide the first Chien search result.

The method according to embodiments of the invention may include squaring the first set of intermediate results to provide a second set of intermediate results.

The method according to embodiments of the invention may include shifting the second set of intermediate results by different shift factors to provide shifted results; and adding the shifted results to provide a second shifted sum.

The method according to embodiments of the invention may include performing a modulo operation on the second shifted sum to provide the second Chien search result.

The method according to embodiments of the invention may include evaluating, by a third hardware circuit, the error locator polynomial for a third element of the finite field to provide a third Chien search result in response to a second set of intermediate results that is generated by the second hardware circuit; wherein the first hardware circuit is substantially larger than the third hardware circuit; and wherein the third element differs from the second element and from the first element.

The method according to embodiments of the invention may include evaluating the error locator polynomial for different elements of the finite field; wherein each evaluation comprises applying a modulo operation only at a last stage of the evaluating.

The method according to embodiments of the invention may include masking bits representative of preliminary results obtained during an evaluation of the error location polynomial; and summing unmasked bits representative of the preliminary results to provide the first set of intermediate results.

The method according to embodiments of the invention may include recovering errors in response to Chien search results.

The method according to embodiments of the invention may include retrieving data stored in a flash memory and performing Reed-Solomon decoding.

The method according to embodiments of the invention may comprising retrieving data stored in a flash memory and performing BCH decoding

BRIEF DESCRIPTION OF THE DRAWINGS

Certain embodiments of the present invention are illustrated in the following drawings:

FIG. 11. is a flow chart of a method for compact Chien search according to an embodiment of the invention.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Figure 4:
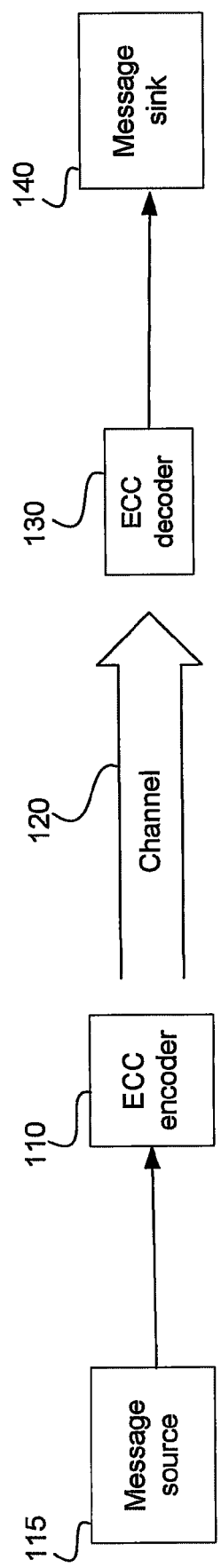
FIG. 4 is a simplified functional block diagram of a system using a compact Chien search, the system being constructed and operative in accordance with certain embodiments of the present invention.

Reference is now made to FIG. 4 which is a simplified functional block diagram of an encoding/decoding system that includes a compact Chien searcher in accordance with certain embodiments of the present invention.

In FIG. 4, message source 115 provides a message m(x) which it may be desired to transmit or to store, e.g. in flash memory, to Error Correction Coding (ECC) encoder 110. ECC encoder 110 may include BCH or Reed-Solomon cyclic error correction coding apparatus and is typically operative for computing and for adding, to the message m(x), redundancy bits, thereby to generate a codeword c(x) of a known codebook such as BCH or Reed-Solomon with known parameters. Channel 120, which may include any medium through which the message is conveyed from ECC encoder 110 to ECC decoder 130. Channel 120 adds errors e(x) to the codeword c(x). ECC encoder 110 can be included in a transmitter while ECC decoder 130 is included in a receiver.

The errors may stem from various physical processes such as thermal noise, deterioration of storage medium over time and, especially after many read/write operations, inaccuracies in the transmitter or receiver hardware. Each error occurs at a particular location within the message, which is assumed to comprise a sequence of bits or of symbols. In the former case, binary BCH code is typically used for encoding and decoding, whereas in the latter case, non-binary BCH code, or RS code is used. In the first, binary, instance, n is used in the foregoing discussion to indicate a bit of the data being read or received in which an error has occurred. In the second, non-binary, instance, n is used in the foregoing discussion to indicate a symbol of the data being read or received in which an error has occurred.

The received data r(x) equals the following: $r(x)=c(x)+e(x)$. Received data r(x) is typically received by an error correcting decoder 130, also termed herein the "receiver". ECC decoder 130, using the redundancy that was added to the message and the known codebook, is operative to substantially reconstruct the original message m(x) and convey it to the intended target, message sink 140. According to certain embodiments of the present invention, the ECC decoder 130 includes a compact Chien searcher.

Figure 5:
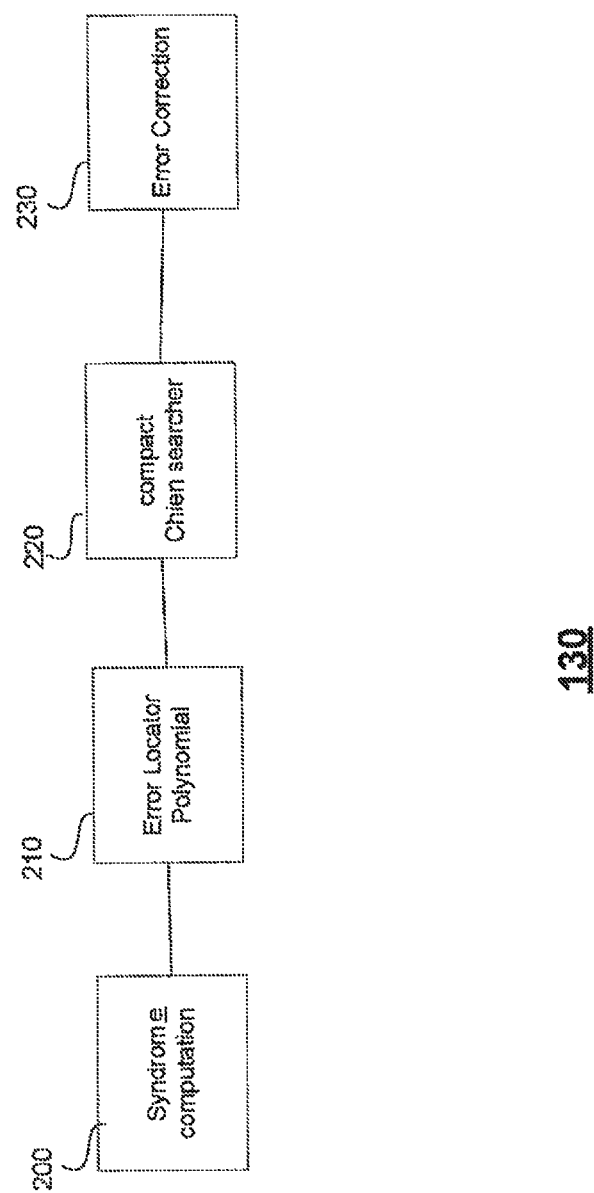
FIG. 5 is a simplified functional block diagram of a decoder of FIG. 4, which uses a compact Chien search, which is constructed and operative in accordance with certain embodiments of the present invention.

Reference is now made to FIG. 5 which is a simplified functional block diagram of ECC decoder 130 of FIG. 4. As shown, the ECC decoder 130 includes a compact Chien searcher 220 and is constructed and operative in accordance with certain embodiments of the present invention.

The ECC encoder 110 can be described in terms of a generation matrix G, thus the encoding process performed by ECC encoder 110 includes a matrix multiplication c=mG. As described above, c is the transmitted codeword and m is the message to be transmitted or, for data storage applications, the data to be stored. The ECC decoder 130 of FIG. 4 is operative to perform syndrome computation (functionality 200 in FIG. 5), such that there exists a parity check matrix H which has the following property: $GH^T=0$. It follows that $cH^T=mGH^T=0$ (formula IV). As described above, the received vector r comprises the transmitted codeword c and the errors added in the channel 120 i.e. r=c+e. The ECC decoder (which in flash memory applications, may be implemented within microcontroller 244 of FIG. 2) computes the syndrome vector s using the parity check matrix. Specifically (formula V):

$$s = rH^T = cH^T + eH^T = mGH^T + eH^T = 0 + eH^T = eH^T, \text{ or in short } s = eH^T.$$

ECC 130 can generate an Error Locator Polynomial (functionality 210 in FIG. 5). Due to the special form of the BCH and RS codes and of the parity check matrix H the set of equations $s = eH^T$ may be solved directly by exhaustive search in the decoder 130 to find the error vector e and correctly decode the received message r(x), however, the exhaustive search is computationally unattractive. Therefore, typically an Error Locator Polynomial (ELP) is introduced, the roots of which correspond to a one to one mapping of the error locations as described above and as is known in the art.

Once the error locator polynomial has been generated by functionality 210, compact Chien searcher 220 that has Error Locator Polynomial evaluation functionality evaluates the Error Locator Polynomial for all the elements of the field over which the Error Locator Polynomial is defined. The elements in the field that zero the error locator polynomial are the error locations. Computations are typically performed in the $GF(q^m)$ field which is a finite field. The evaluation of the Error Locator Polynomial includes searching the roots of the Error Locator Polynomial.

Error correction unit 230 corrects errors in response to the roots of the error locator polynomial that were found by compact Chien searcher 220.

Figure 6A:
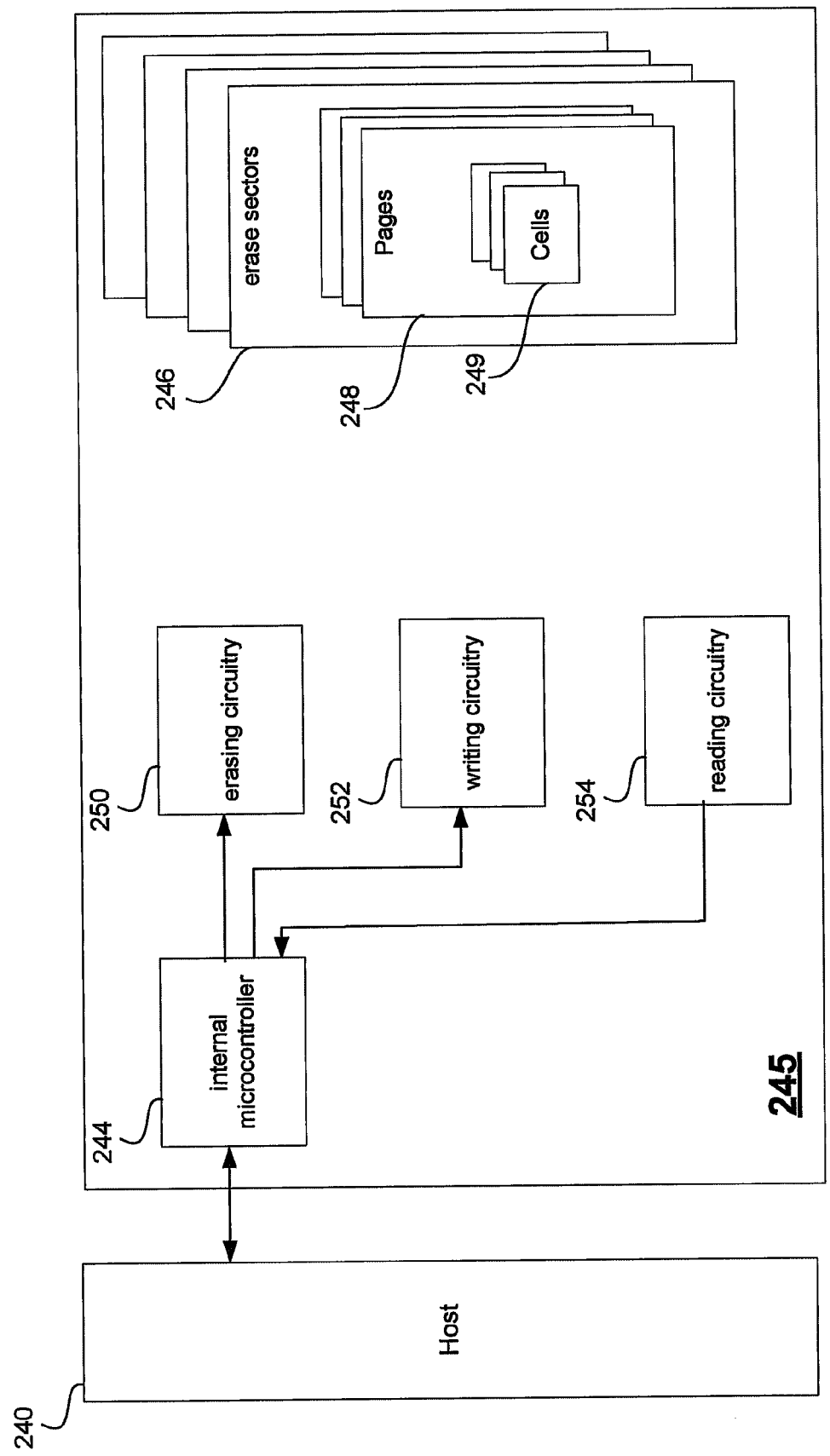
FIG. 6A is a simplified functional block diagram of flash memory apparatus that includes, e.g. in an internal microcontroller, the encoding/decoding system of FIG. 4 and particularly the decoder of FIG. 5, all operative in accordance with certain embodiments of the present invention.

FIG. 6A is a simplified functional block diagram of a flash memory apparatus comprising, e.g. in an internal microcontroller 244, the encoding/decoding system of FIG. 4 and particularly the decoder of FIG. 5, all operative in accordance with certain embodiments of the present invention. As shown, the flash memory apparatus of FIG. 6A typically interacts with a host 240 and typically includes the microcontroller 244 as well as one or more erase sectors 246 each comprising one or more pages 248 each including cells 249. The microcontroller 244 effects erasing of, writing on and reading from the erase sector/s 246, by suitably controlling erasing circuitry 250, writing circuitry 252 and reading circuitry 254, respectively. According to certain embodiments of the present invention, microcontroller 244 includes an error correction code decoder operative to receive data from the reading circuitry 254, to decode the data, including performing a compact Chien search for error locations, and to provide the data thus decoded to the host 240 which therefore constitutes both source 100 and sink 140 of FIG. 4, in memory applications.

In flash memory applications, the channel 120 generally represents the deterioration in the data stored in memory over time and due to repeated cycling, and the encoding and decoding (functionalities 110 and 130 in FIG. 4) are performed within one or more suitable controllers e.g. the microcontroller 244 of FIG. 6 which is external to the flash memory device 245 or an external controller operatively associated with the host 240 and external to device 245.

Microcontroller 244 can include (or otherwise has the functionality of) compact Chien searcher 220. Compact Chien searcher 220 can be characterized by at least one of the following characteristics or a combination thereof: (i) utilizing dependencies between intermediate results generated during different evaluations of the error locator polynomial—generating sets of intermediate results by hardware circuits and utilizing these intermediate results by smaller hardware circuits; (ii) performing modulo operations at the end of the Chien Search; (iii) replacing addition and/or multiplication operation by masking operations and shifting operations.

Figure 7:
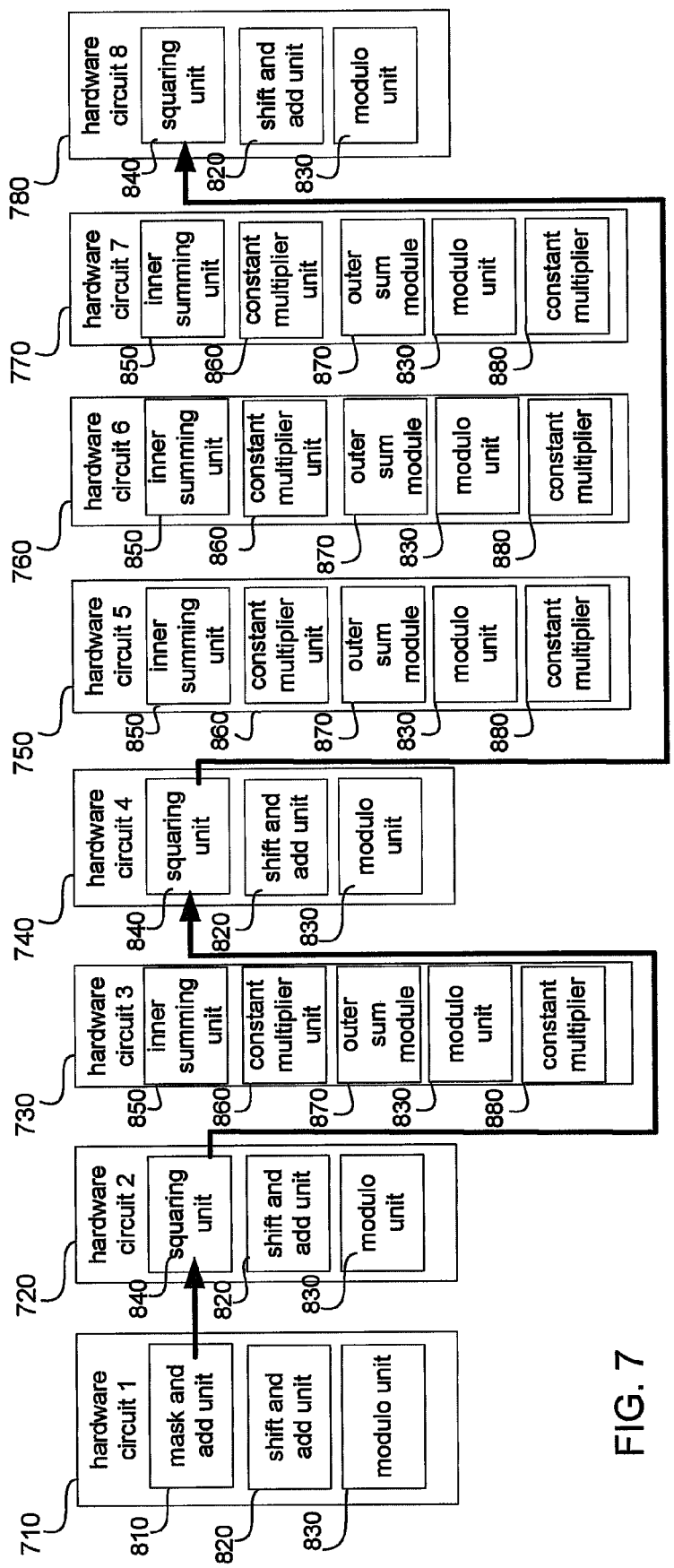
FIG. 7. is a simplified functional block diagram of a compact Chien searcher according to an embodiment of the invention.

FIG. 7. is a simplified functional block diagram of a compact Chien searcher 220 according to an embodiment of the invention.

Compact Chien searcher 220 is illustrated for a case in which p=8 (eight Chien searches are provided per cycle) t=66 and the Galois field is $GF(2^{15})$.

Figure 6B:
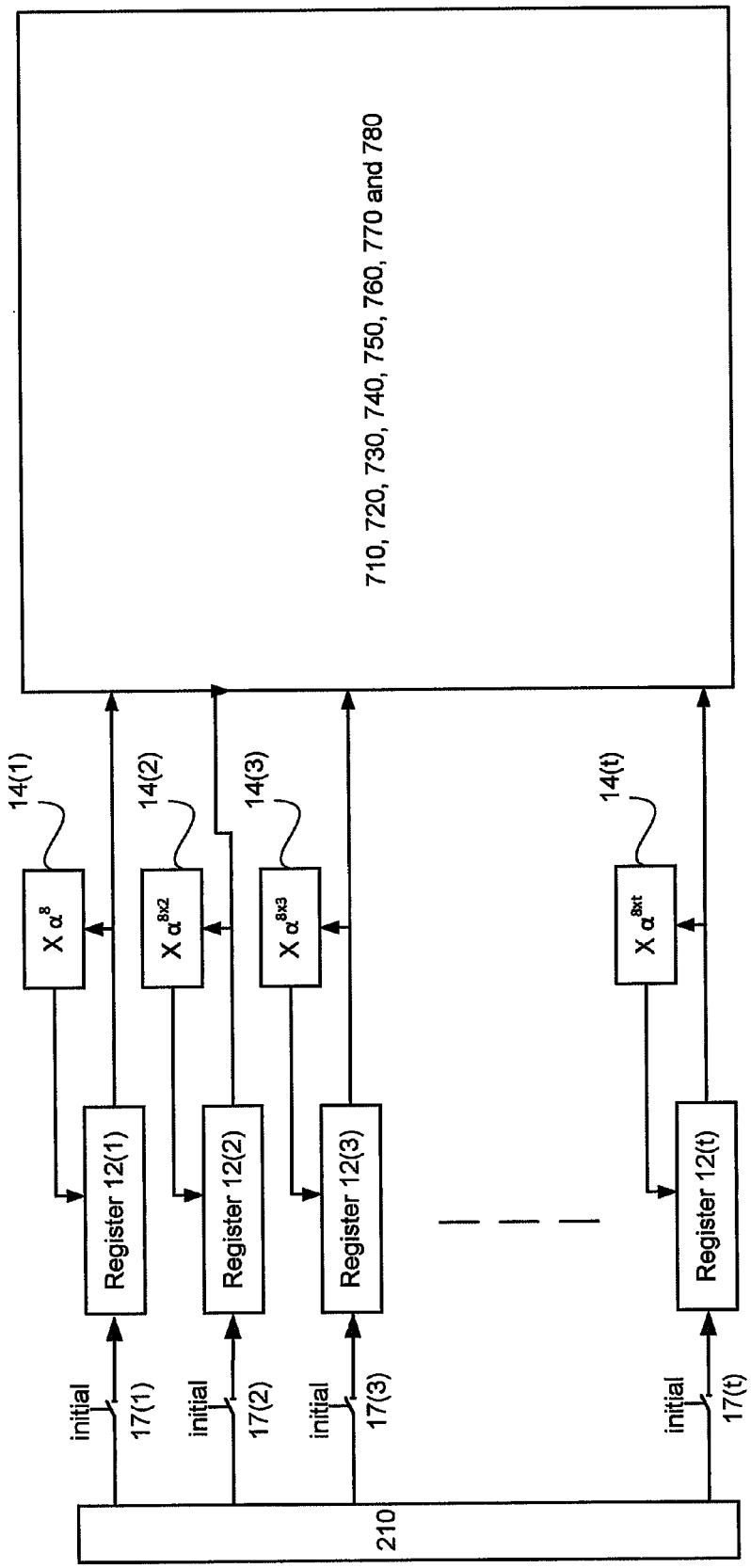
FIG. 6B illustrates a portion of an error location polynomial and a compact Chien searcher according to an embodiment of the invention.

Compact Chien searcher 220 includes a set of registers 12(1)-12(t). This set of registers includes sixty six registers, each fifteen bit long, that are initially fed with the elements of the error location polynomial (ELP) output from error location polynomial calculation unit 210. FIG. 6B illustrates registers 12(1)-12(t) that are connected to error location polynomial calculation unit 210 via switches 17(1)-17(t), each switch configured to provide to a register the output of error location polynomial calculation unit 210 or an initial value. The registers provide their output to multipliers 14(1)-14(t), that multiply the output of the registers by different powers of $\alpha^8$, thus multiplier 14(1) multiples the output of register 12(1) by $\alpha^8$ and multiplier 14(t) multiples the output of register 12(t) by $\alpha^{8t}$.

Compact Chien searcher 220 also includes eight hardware circuits 710, 720, 730, 740, 750, 760, 770 and 780—each provides one Chien search value by evaluating the error locator polynomial for a single element.

Hardware circuit 710 calculates r(1), hardware circuit 720 calculates r(2), 730 calculates r(3), 740 calculates r(4), 750 calculates r(5), 760 calculates r(6), 770 calculates r(7) and 780 calculates r(8).

Hardware circuit 710 is referred to as a first hardware circuit. It includes mask and add unit 810, shift and add unit 820 and modulo unit 830.

Hardware circuit 720 is referred to as a second hardware circuit. Each of hardware circuits 720, 740 and 780 includes squaring unit 840, shift and add unit 820 and modulo unit 830.

Hardware circuit 740 is referred to as a third hardware circuit.

Each of the hardware circuits 730, 750, 760 and 770 includes inner summing unit 850, constant multiplier unit 860, outer summation unit 870, modulo unit 830 and constant multiplier unit 880.

A set of intermediate results calculated by mask and add unit 810 of hardware circuit 710 is provided to squaring unit 840 of hardware circuit 720. A set of intermediate results calculated by squaring unit 840 of hardware circuit 720 is provided to squaring unit 840 of hardware circuit 740. A set of intermediate results calculated by squaring unit 840 of hardware circuit 740 is provided to squaring unit 840 of hardware circuit 780.

It is noted that the intermediate results calculated by mask and add unit 810 of hardware circuit 710 can be provided to hardware circuit 740 but in this case the squaring module of these hardware circuits will be required to perform more than a single squaring operation. The same applies to a provision of the set of intermediate results calculated by squaring unit 840 of hardware circuit 720 to squaring unit 840 of hardware circuit 780.

First hardware circuit 710 is bigger than second and third hardware circuits 720 and 740 as the mask and add unit 810 consumes more area than squaring unit 840.

Figure 1:
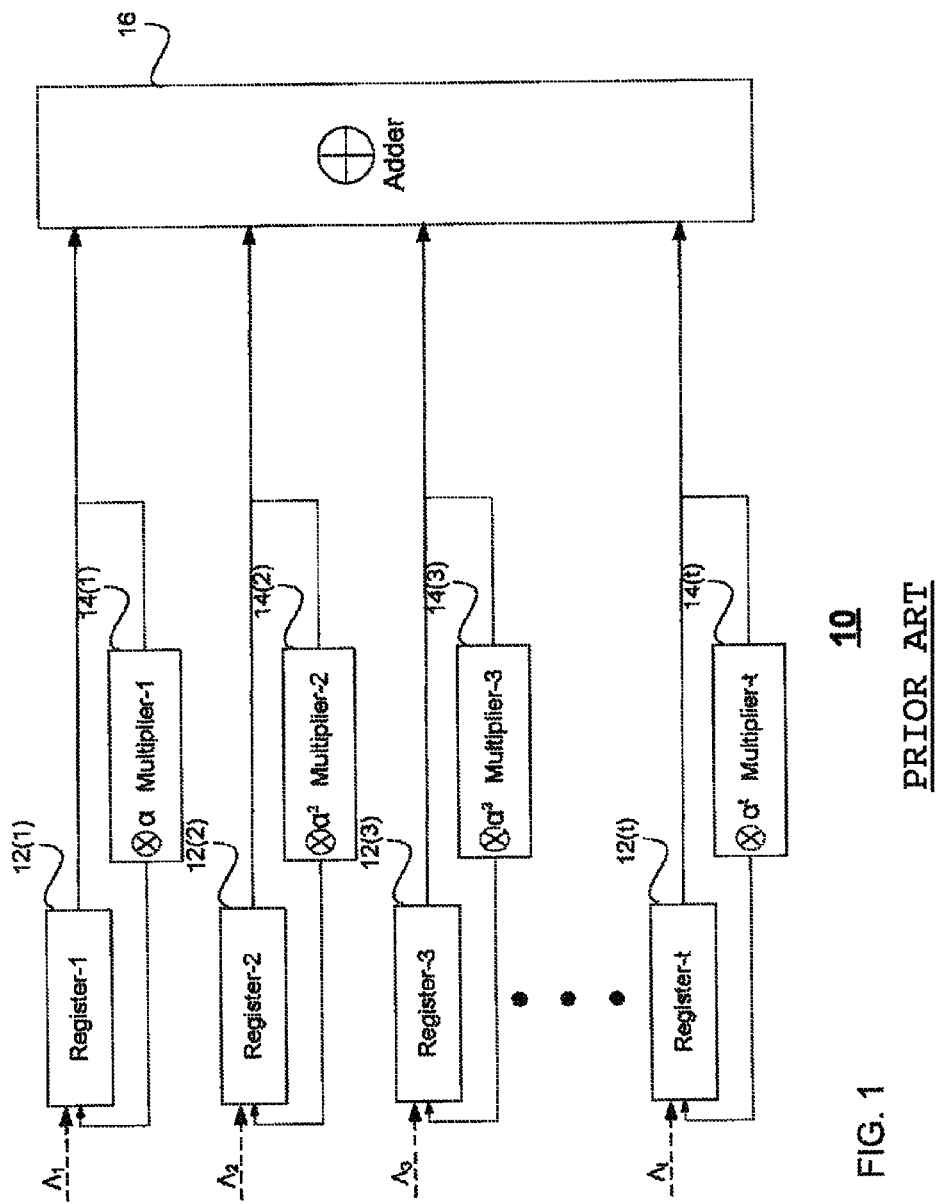
FIG. 1 is a functional block diagram illustration of an "in series" prior art circuit.
Figure 2A:
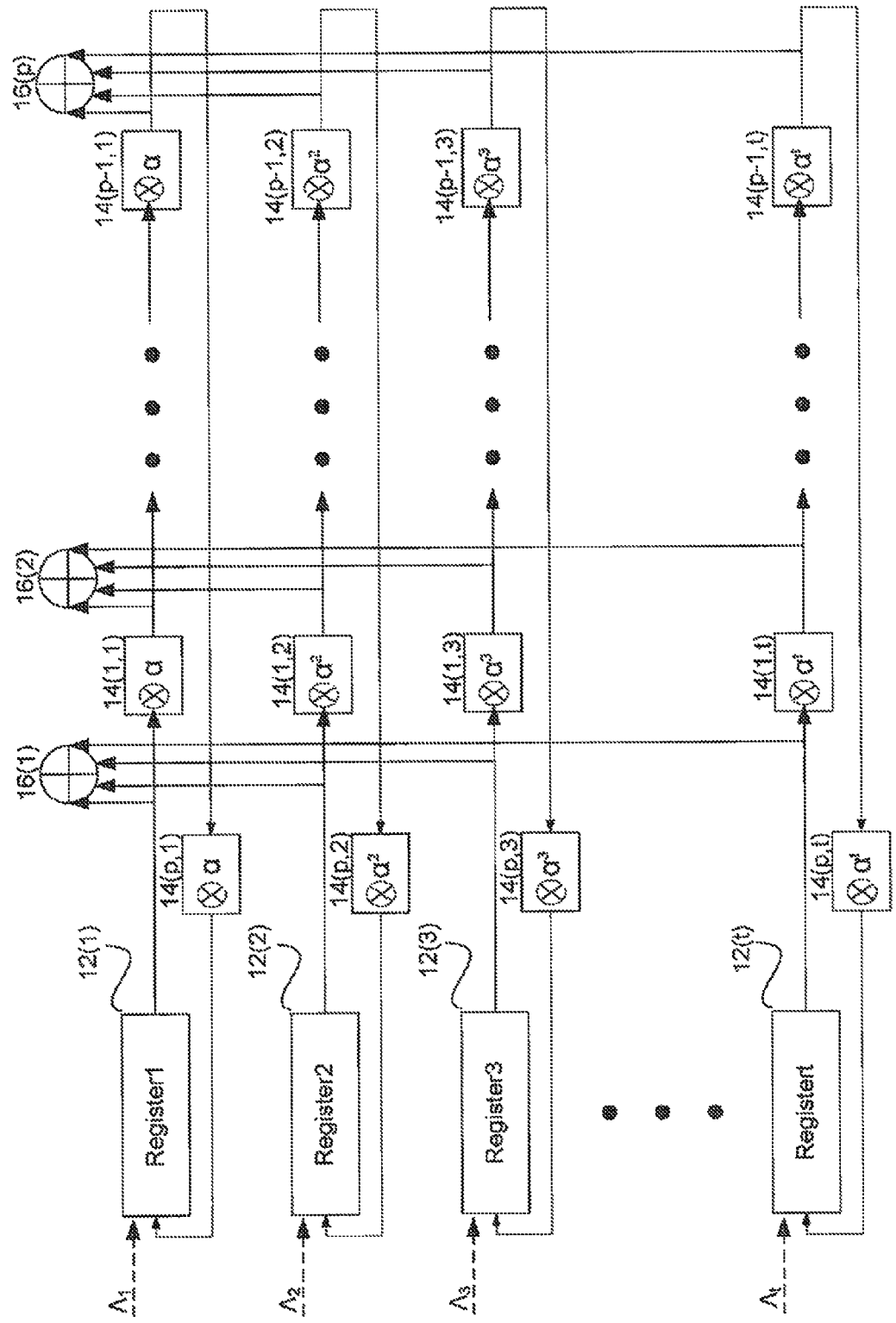
FIG. 2A and FIG. 2B are functional block diagram illustrations of "in parallel" prior art circuits.
Figure 2B:
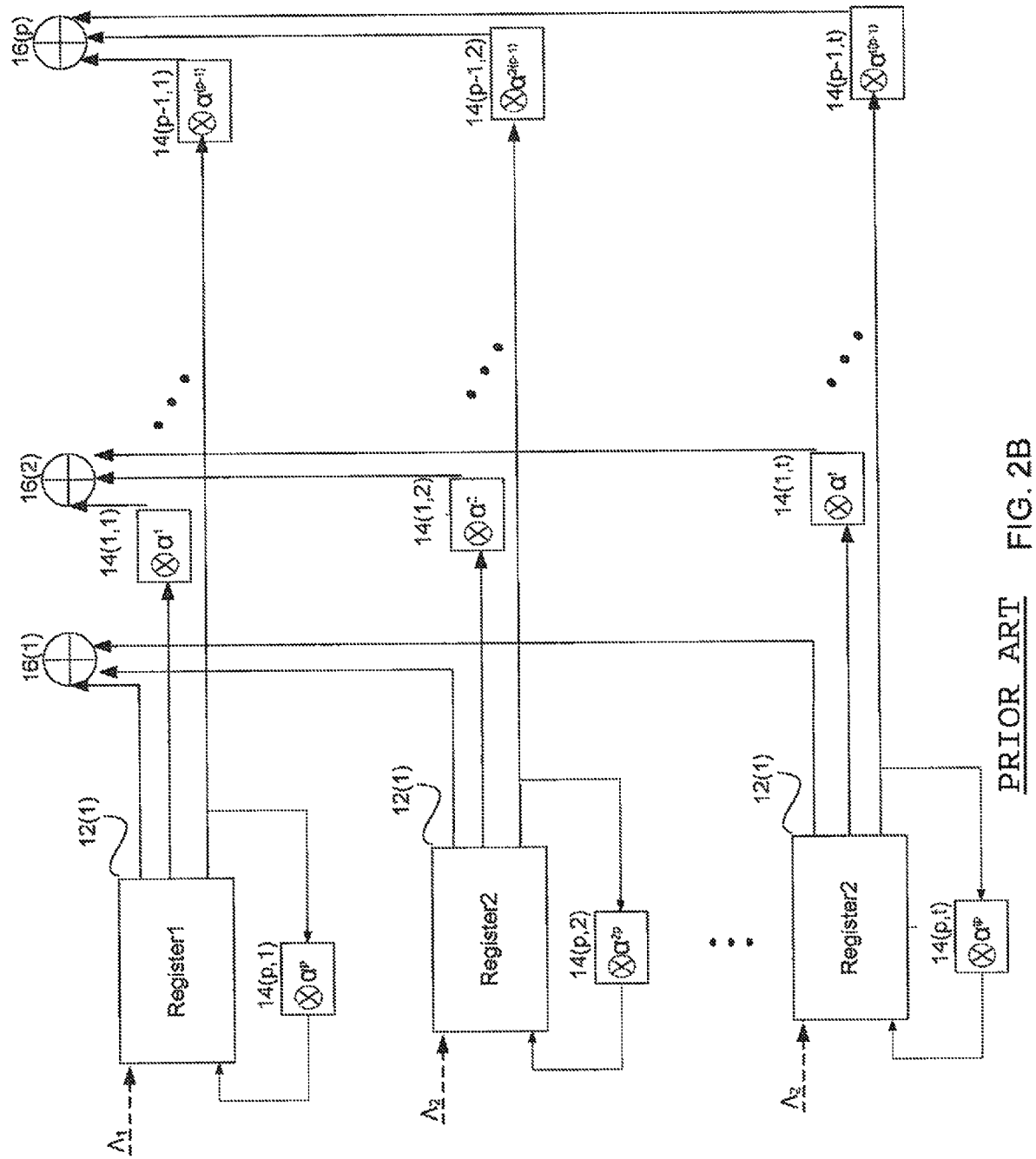
Figure 3:
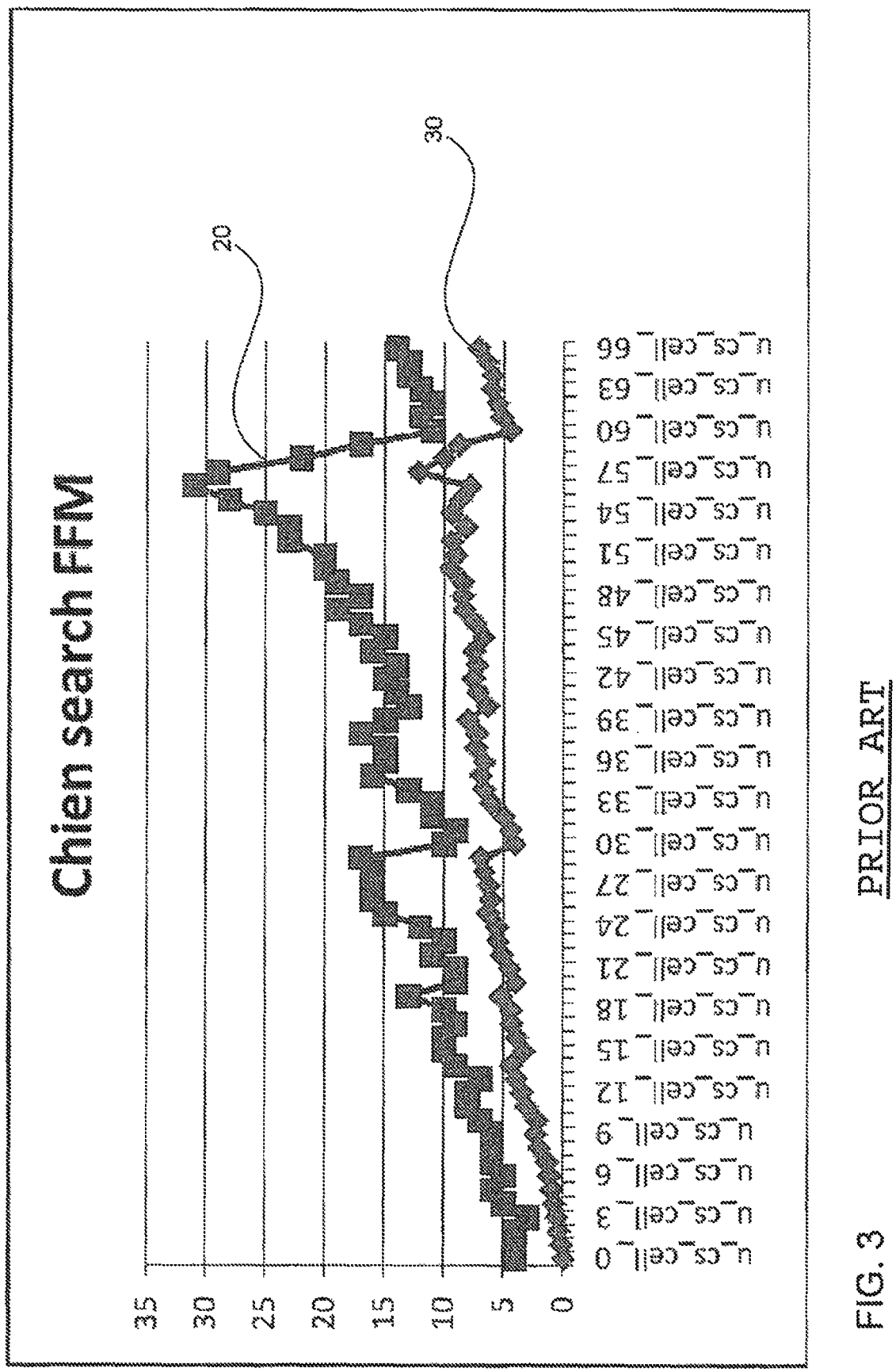
FIG. 3 illustrates area consumed by prior art Galois multipliers.

The over all size of hardware circuits 710-780 is smaller than the size of a prior art circuit (as illustrated in FIG. 2A or 2B) in the combination of units 14(j,1) ... 14(j,t) and 16(j) for some j) due to: (i): using intermediate results of R(1) when calculating R(2), R(4), R(8) (hardware sharing) (ii): Applying only one modulo operation on the sum of p products (instead of sum of p modulo operation of the products), (iii): The calculation is separated to an inner sum that is followed by a multiplication by a constant, and an outer sum in R(3), R(5), R(6) and R(7) calculation. Each of these hardware circuits (referring to (iii)) includes an inner summation unit 850, a constant multiplier unit 860, an outer summation module 870, modulo circuit 830 and can also include a constant multiplier 880.

The following mathematical description illustrates how the size reduction can be achieved.

$\Lambda(\alpha^i)$ or $\Lambda(\alpha^{8k+i})$ (where k is some non-negative integer) is denoted by r(i). The compact Chien search includes evaluating the error locator polynomial for each value of i (each power of alpha) it can be re-written as follows:

$$r(i) = \sum_{j=0}^{t} \lambda_j \alpha^{ij}$$

$$= 1 + \sum_{j=0}^{t} \lambda_j \alpha^{ij}$$

$$= 1 + \sum_{j=1}^{t} \left( \sum_{m=0}^{14} (\lambda_{j,m} X^m \alpha^{ij}) \mathrm{mod} P(X) \right)$$

$$= 1 + \sum_{m=0}^{14} \left( \sum_{j=1}^{t} \lambda_{j,m} \alpha^{ij} \right) X^m \mathrm{mod} P(X)$$

$$= 1 + \sum_{m=0}^{14} V_{i,m} X^m \mathrm{mod} P(X)$$

$$= 1 + \mathrm{mod} P(X) \left[ \sum_{m=0}^{14} V_{i,m} X^m \right]$$

Where $$V_{i,m} = \sum_{j=1}^{t} \lambda_{j,m} \alpha^{ij}$$

and $\lambda_{j,m}$ is the m'th bit of the content $\lambda_t$ of the j'th register. $\alpha^{ij}$ is a constant that is calculated ahead of time.

Different hardware circuits can be designed for different elements.

Consider the case of i=1. In this case r(1)=1+ $\Sigma_{m=0}^{14} V_{1,m} X_m \mathrm{\ mod\ } P(X)$; where $$V_{1,m} = \sum_{j=1}^{t} \lambda_{j,m} \alpha^{j}$$

The calculation of r(1)—which evaluates if alpha is a root of the error locator polynomial can be divided into three stages: (i) calculation of $V_{1,m}$ to provide a set of intermediate results; (ii) calculating $$\sum_{m=0}^{14} V_{i,m} X^m$$

and (iii) performing a modulo operation.

The calculation of $V_{1,m}$ can be performed by masking and summation operation, as $\lambda_{j,m}$ is one bit long. If $\lambda_{j,m}$ is zero ('0') $\alpha^j$ is masked and if $\lambda_{j,m}$ is set ('1') $\alpha^j$ is not masked and can be added to other unmasked powers of $\alpha$. Accordingly the masking does not require gate count at all, and the summation requires an adder that include XOR gates depending on the number of set bits in $\alpha^j$.

Figure 8:
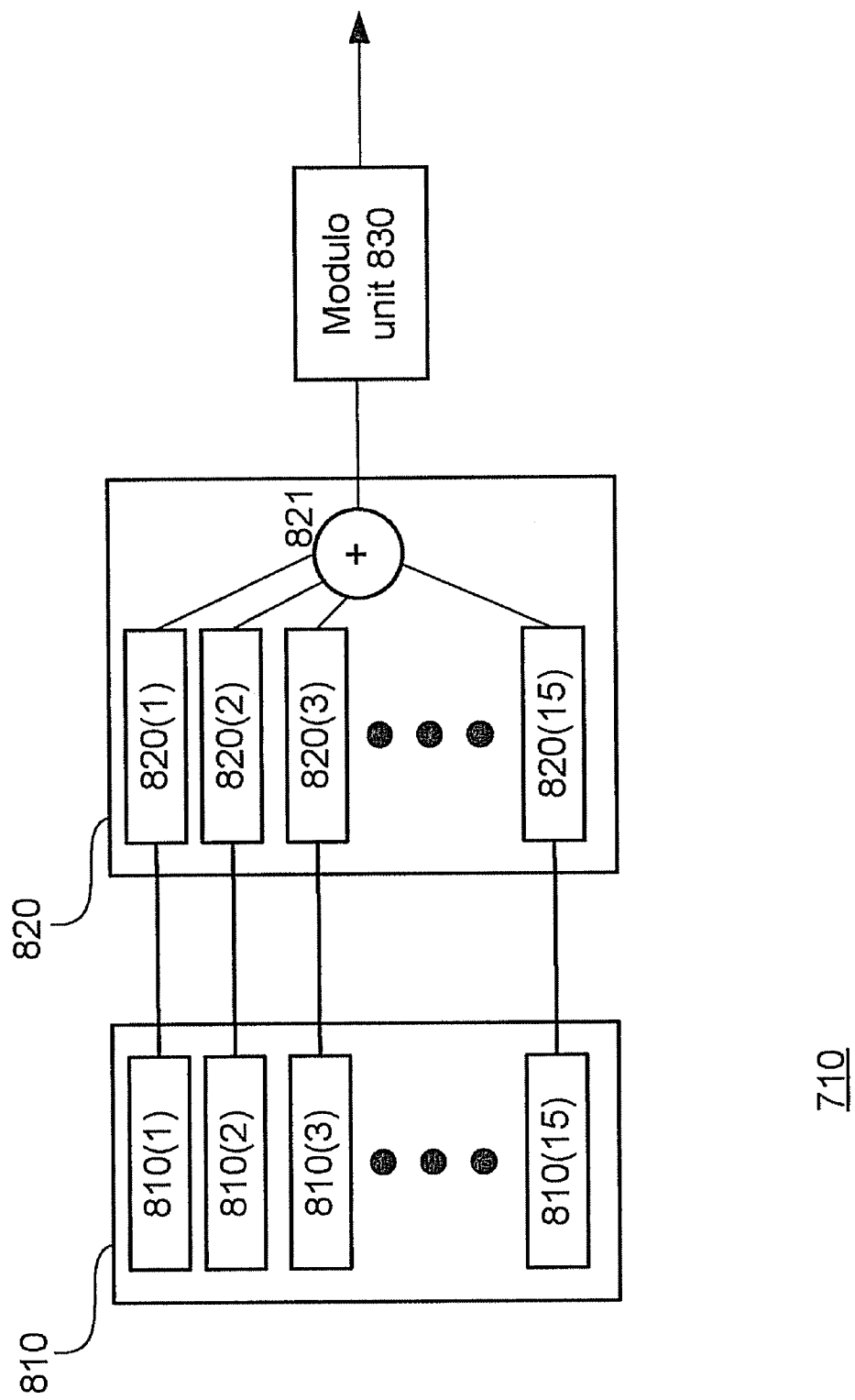
FIG. 8. is a simplified functional block diagram of hardware circuits of the compact Chien searcher of FIG. 7 according to an embodiment of the invention.

The calculation of $V_{1,m}$ can be calculated by mask and add unit 810 of FIG. 8. Mask and add unit 810 sums unmasked bits representative of preliminary results obtained during an evaluation of the error locator polynomial to provide the first set of intermediate results. The preliminary results are stored in a group of registers.

Mask and add unit 810 includes fifteen masking units and adding circuits denoted 810(1)-810(15). Each masking unit (also referred to as multiplier) receives $\alpha, \alpha^2, \ldots, \alpha^{15}$ and a set of masking bits. The m'th masking unit (810(m)) receives $\alpha, \alpha^2, \ldots, \alpha^{15}$, multiplies the i'th power of alpha (i ranges between 1 and 15) by the m'th bit of the i'th registers, and add the results of these multiplications. The multiplication by $\lambda_{i,m}$ is equivalent to a masking operation.

For example, masking unit 810(1) calculates $$V_{1,0} = \sum_{j=0}^{14} \lambda_{j,0} * \alpha^j$$

—by multiplying the different powers of alpha by the least significant bits of different registers and then adding the unmasked bits.

Yet for another example, masking unit 810(14) calculates $$V_{1,14} = \sum_{j=0}^{14} \lambda_{j,14} * \alpha^j$$

—by multiplying the different powers of alpha by the most significant bits of different registers and then adding the unmasked bits.

The calculation of $V_{i,m} * X^m$ can be performed by performing shift operations—and especially by performing m shifts of $V_{i,m}$. Calculating $$\sum_{m=0}^{14} V_{i,m} X^m$$

requires a sequence of shift operations (by different shift factors) and a summation. The shift operation does not require gate count at all. The summation requires adders that include XOR gates depending on the overlapping between $V_{i,m} * X^m$.

The calculation of $\Sigma V_{i,m} X^m$ can be performed by shift and add unit 820 of FIG. 8. Shift and add unit 820 shifts the first set of intermediate results by different shift factors (the shift factor m has values that range between zero and fourteen) to provide shifted results and adds the shifted results to provide a first shifted sum. Shift and add unit 820 includes fifteen shifters 820(1)-820(15)—each shifts $V_{i,m}$ by a shift factor and also includes an adder 821 that adds the shifted results of shifters 820(1)-820(15).

The modulo operation can be executed by any prior art modulo operation circuit. For example, a 29 bit number can be concerted by a 29 bits number by applying a modulo operation that involves performing XOR operations between constant vectors $x^i$ modulo $p(x)$, depending on whether in the original value the bit corresponding to $x^i$ was 1 or 0.

The evaluation of the error locator polynomial for elements that equal $\alpha^q$ where q is bigger than one and is a power of two ($q=2^k$) can utilize intermediate results calculated by a hardware circuit that calculates the error locator polynomial for an element that equals $2^{k-1}$. In other words—a hardware circuit that calculates $r(2^k)$ can utilize intermediate results generated by another hardware circuit that calculates $r(2^{k-1})$. This is also true for the case of $r(f\times 2^k)$ and $r(f\times 2^{k-1})$.

This is illustrated by the following example:

$$V_{2,m} = \sum_{j=1}^{t} \lambda_{j,m} \alpha^{2j}$$

$$= \sum_{j=1}^{t} (\lambda_{j,m} \alpha^j)^2$$

$$= \left(\sum_{j=1}^{t} (\lambda_{j,m} \alpha^j)\right)^2$$

$$= V_{1,m^2}$$

Thus: $V_{2,m} = V_{1,m}^2$; $V_{4,m} = V_{2,m}^2$ and $V_{8,m} = V_{4,m}^2$
Therefore, $r(2)$ can be calculated by:

$$r(2) = 1 + \sum_{m=0}^{14} V_{2,m} X^m \bmod P(X) = 1 + \sum_{m=0}^{14} V_{1,m}^2 X^m \bmod P(X)$$

The intermediate results can be squared by a squaring module. Squaring modules are known in the art and are quite simple and require relatively small number of gates—for example only 7 XOR gates in $GF(2^{15})$ where the field is defined by the polynomial $P(X)=X^{15}+X+1$.

Figure 9:
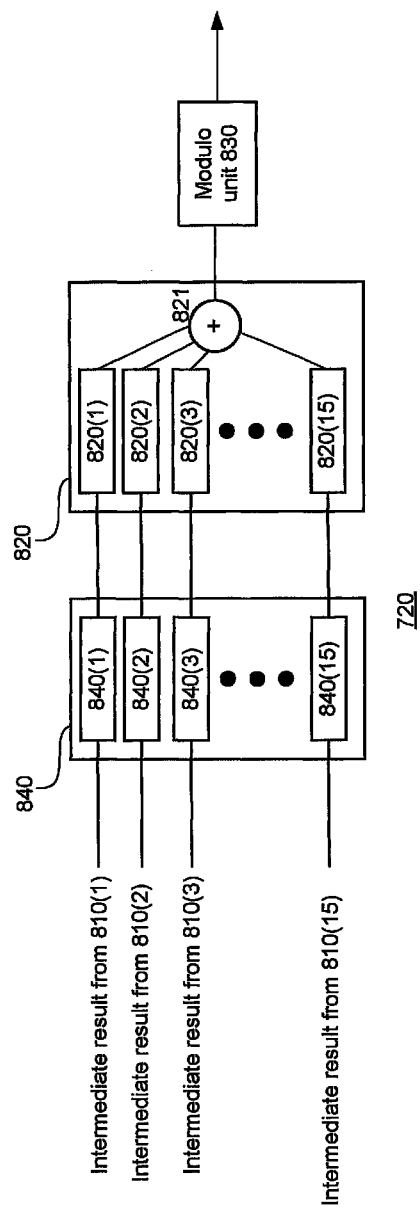
FIG. 9. is a simplified functional block diagram of hardware circuits of the compact Chien searcher of FIG. 7 according to an embodiment of the invention.

FIG. 9 illustrates a second hardware circuit 720 according to an embodiment of the invention.

Second hardware circuit 720 includes squaring unit 840, shift and add unit 820 and modulo unit 830.

Squaring unit 840 includes fifteen squaring circuits 840(1)-840(15), each squares a single intermediate result provided by a corresponding masking unit and adding circuit of mask and add unit 810.

According to yet another embodiment of the invention the evaluation of an error locator polynomial for elements that differ from a power of two can be executed by a compact hardware unit that includes an inner summing unit 850, constant multiplier unit 860, outer summation unit 870, modulo unit 830 and constant multiplier 880.

This can be explained by re-writing the error locator polynomial as follows:

$$r(i) = \sum_{j=0}^{t} \lambda_j \alpha^{ij} = \sum_{r=0}^{\lceil \frac{t}{s} \rceil} \left(\sum_{j=0}^{s-1} \lambda_{j+sr} * \alpha^{ij}\right) \alpha^{irs}$$

$$r(i) - 1 + \sum_{j=1}^{t} \lambda_j \alpha^{ij} - 1 +$$

-continued $$\sum_{k=0}^{t-1} \lambda_{k+1} \alpha^{i(k+1)} - 1 + \sum_{r=0}^{\lceil \frac{t-1}{s} \rceil} \left(\sum_{j=0}^{s-1} \lambda_{(j+1)+sr} * \alpha^{ij}\right) \alpha^{i(rs+1)}$$

$$r(i) = 1 + \left(\sum_{r=0}^{\lceil \frac{t-1}{s} \rceil} \left(\sum_{j=0}^{s-1} \lambda_{(j+1)+sr} * \alpha^{ij}\right) \alpha^{irs}\right) * \alpha^i$$

Inner summing unit 880 may operate by using the same technique used to calculate $r(1)$ but being responsive to only s elements of $\lambda$. It calculates the following expression:

$$\sum_{j=0}^{s-1} \lambda_{j+1+sr} * \alpha^{ij}.$$

This configuration performs a majority of calculations with constants that have smaller number of ones (in relation to the prior art constants) and hence require less area in the implementation.

Constant multiplier unit 860 and outer summation unit 870 do not perform a modulo operation and calculate the following expression:

$$\sum_{r=0}^{\lceil \frac{t-1}{s} \rceil} \left(\sum_{j=0}^{s-1} \lambda_{(j+1)+sr} * \alpha^{ij}\right) \alpha^{irs}$$

Modulo unit 830 performs modulo operation to provide an intermediate modulo result.

Constant multiplier 880 multiples the intermediate modulo result by a power of alpha (i) that is responsive to the index of the element for which the error locator polynomial is evaluated.

By implementing the re-written equation, a much simpler and compact constant multiplier can be used.

Figure 10:
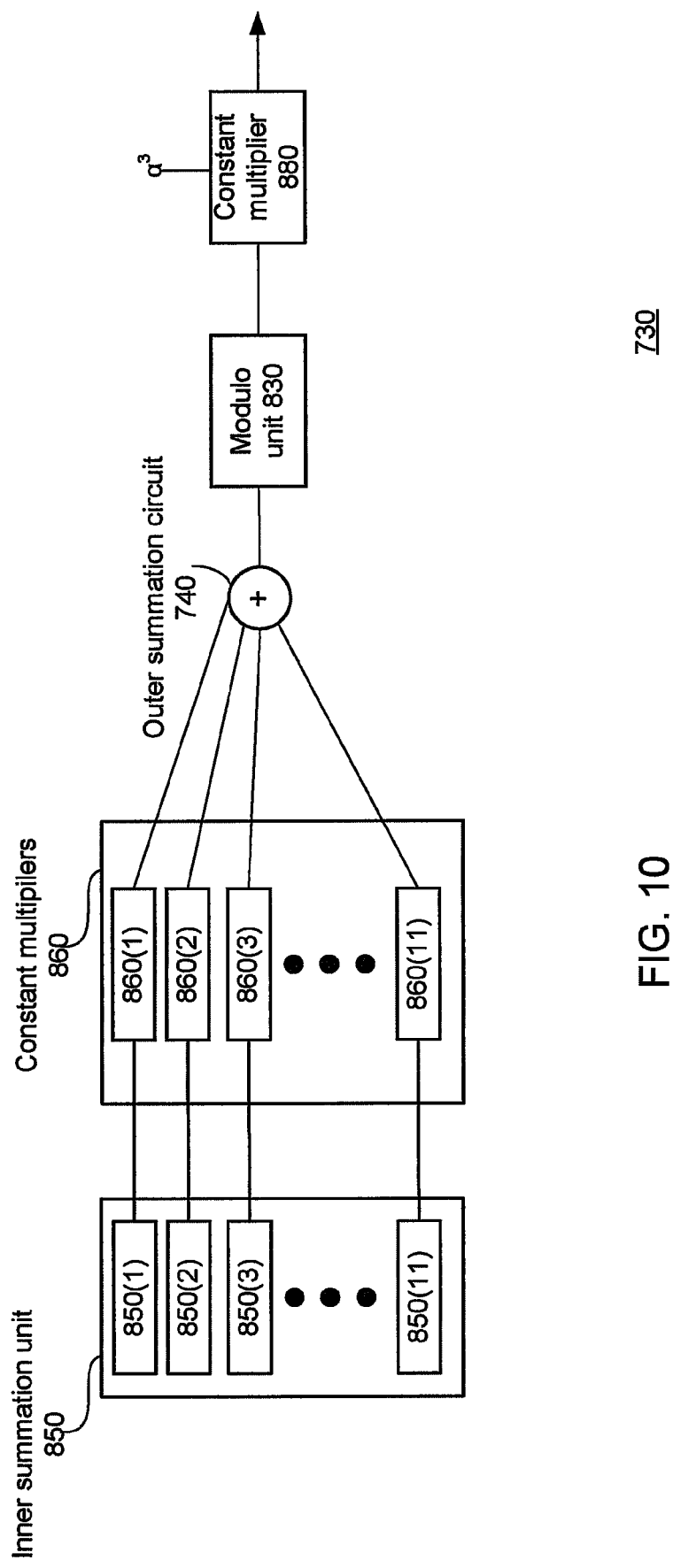
FIG. 10. is a simplified functional block diagram of hardware circuits of the compact Chien searcher of FIG. 7 according to an embodiment of the invention.

FIG. 10 illustrates hardware circuit 730 according to an embodiment of the invention.

Hardware circuit 730 includes inner summation unit 850, constant multiplier unit 860, outer summation module 870, modulo circuit 830 and can also include a constant multiplier 880.

Inner summation unit 850 includes multiple inner summation units 850(1)-850(11). The outputs of these units is fed to multiple constant multipliers 860(1)-860(11) that multiply these outputs by a constant without performing modulo operation to provide multiple results. The multiple results are fed to outer summation circuit 870 that sums the multiple results to provide another result that is fed to modulo circuit 830. The output of module circuit can be fed to constant multiplier 880 that multiplies the output of modulo unit 830 by $\alpha^r$. For example, in hardware circuit 740—that calculated ELP(r=3) the constant multiplier 880 multiples the output of modulo unit 830 by $\alpha^3$.

FIG. 11 illustrates method 1100 for a compact Chien search according to an embodiment of the invention. The compact Chien search provides Chien search results and evaluates the Chien search results. The evaluation may involve determining which Chien Search result is indicative of a root of the error location polynomial.

Method 1100 can include stage 1110

Stage 1110 includes evaluating, by a first hardware circuit an error locator polynomial for a first element of a finite field over which the error locator polynomial is defined to provide a first set of intermediate results and a first Chien search result.

Stage 1120 includes providing the first set of intermediate results to a second hardware circuit. Stage 1120 follows the generation of the first set of intermediate results by the first hardware circuit but can be executed before stage 1110 ends by a provision of the first Chien search result.

Stage 1120 is followed by stage 1130 of evaluating, by the second hardware circuit, the error locator polynomial for a second element of the finite field to provide a second Chien search result in response to the first set of intermediate results. The first hardware circuit is substantially bigger than the second hardware circuit and wherein the first element differs from the second element.

Stage 1110 can includes either one of stages 1112, 1114, 1116 or a combination thereof.

Stage 1112 includes masking bits representative of preliminary results obtained during an evaluation of the error location polynomial and summing unmasked bits representative of the preliminary results to provide the first set of intermediate results.

Stage 1114 includes shifting the first set of intermediate results by different shift factors to provide shifted results and adding the shifted results to provide a first shifted sum.

Stage 1116 includes performing modulo operation on the first shifted sum to provide the first Chien search result.

Stage 1130 can includes either one of stages 1132, 1134, 1136 or a combination thereof.

Stage 1132 includes squaring the first set of intermediate results to provide a second set of intermediate results.

Stage 1134 includes shifting the second set of intermediate results by different shift factors to provide shifted results and adding the shifted results to provide a second shifted sum.

Stage 1136 includes performing modulo operation on the second shifted sum to provide the second Chien search result.

Method 1100 can also include stage 1150.

Stage 1150 includes providing the second set of intermediate results to a third hardware circuit. Stage 1150 follows the generation of the second set of intermediate results by the second hardware circuit but can be executed before stage 1130 ends by a provision of the second Chien search result.

Stage 1150 is followed by stage 1160 of evaluating, by a third hardware circuit, the error locator polynomial for a third element of the finite field to provide a third Chien search. The first hardware circuit is substantially bigger than the third hardware circuit and the third element differs from the second element and from the first element. Referring to the example set fourth in previous figures, a second set of intermediate results from hardware circuit 720 can be fed to hardware circuit 740.

Method 1100 can include evaluating the error locator polynomial for different elements of the finite field, wherein each evaluation comprises applying modulo operation only at a last stage of the evaluating. Referring to the example set fourth in previous figures, each hardware circuit out of 710, 720, 730, 740, 750, 760, 770 and 780 performs the modulo operation only at its last stage.

Either one of stages can be followed by stage 1180 of recovering errors in response to Chien search results.

Method 1100 can include performing the Chien Search to detect errors in encoded data stored in a flash memory; wherein the data is encoded in accordance with a Reed-Solomon.

Method 1100 can include performing the Chien Search to detect errors in encoded data stored in a flash memory; wherein the data is encoded in accordance with a BCH algorithm.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Certain operations are described herein as occurring in the microcontroller internal to a flash memory device. Such description is intended to include operations which may be performed by hardware which may be associated with the microcontroller such as peripheral hardware on a chip on which the microcontroller may reside. It is also appreciated that some or all of these operations, in any embodiment, may alternatively be performed by the external, host-flash memory device interface controller including operations which may be performed by hardware which may be associated with the interface controller such as peripheral hardware on a chip on which the interface controller may reside. Finally it is appreciated that the internal and external controllers may each physically reside on a single hardware device, or alternatively on several operatively associated hardware devices.

Any data described as being stored at a specific location in memory may alternatively be stored elsewhere, in conjunction with an indication of the location in memory with which the data is associated. For example, instead of storing page- or erase-sector-specific information within a specific page or erase sector, the same may be stored within the flash memory device's internal microcontroller or within a microcontroller interfacing between the flash memory device and the host, and an indication may be stored of the specific page or erase sector associated with the cells.

It is appreciated that the teachings of the present invention can, for example, be implemented by suitably modifying, or interfacing externally with, flash controlling apparatus. The flash controlling apparatus controls a flash memory array and may comprise either a controller external to the flash array or a microcontroller on board the flash array or otherwise incorporated therewithin. Examples of flash memory arrays include Samsung's K9XXG08UXM series, Hynix's HY27UK08BGFM Series, Micron's MT29F64G08TAAWP or other arrays such as but not limited to NOR or phase change memory. Examples of controllers which are external to the flash array they control include STMicroelectrocincs's ST7265x microcontroller family, STMicroelectrocincs's ST72681 microcontroller, and SMSC's USB97C242, Traspan Technologies' TS-4811, Chipsbank CBM2090/CBM1190. Examples of commercial IP software for Flash file systems are: Denali's Spectra™ NAND Flash File System, Aarsan's NAND Flash Controller IP Core and Arasan's NAND Flash File System. It is appreciated that the flash controller apparatus need not be NAND-type and can alternatively, for example, be NOR-type or phase change memory-type.

Flash controlling apparatus, whether external or internal to the controlled flash array, typically includes the following components: a Memory Management/File system, a NAND interface (or other flash memory array interface), a Host Interface (USB, SD or other), error correction circuitry (ECC) typically comprising an Encoder and matching decoder, and a control system managing all of the above.

The present invention may for example interface with or modify, as per any of the embodiments described herein, one, some or all of the above components and particularly with the ECC component.

It is appreciated that software components of the present invention including programs and data may, if desired, be implemented in ROM (read only memory) form including CD-ROMs, EPROMs and EEPROMs, or may be stored in any other suitable computer-readable medium such as but not limited to disks of various kinds, cards of various kinds and RAMs. Components described herein as software may, alternatively, be implemented wholly or partly in hardware, if desired, using conventional techniques.

Included in the scope of the present invention, inter alia, are electromagnetic signals carrying computer-readable instructions for performing any or all of the steps of any of the methods shown and described herein, in any suitable order; machine-readable instructions for performing any or all of the steps of any of the methods shown and described herein, in any suitable order; program storage devices readable by machine, tangibly embodying a program of instructions executable by the machine to perform any or all of the steps of any of the methods shown and described herein, in any suitable order; a computer program product comprising a computer useable medium having computer readable program code having embodied therein, and/or including computer readable program code for performing, any or all of the steps of any of the methods shown and described herein, in any suitable order; any technical effects brought about by any or all of the steps of any of the methods shown and described herein, when performed in any suitable order; any suitable apparatus or device or combination of such, programmed to perform, alone or in combination, any or all of the steps of any of the methods shown and described herein, in any suitable order; information storage devices or physical records, such as disks or hard drives, causing a computer or other device to be configured so as to carry out any or all of the steps of any of the methods shown and described herein, in any suitable order; a program pre-stored e.g. in memory or on an information network such as the Internet, before or after being downloaded, which embodies any or all of the steps of any of the methods shown and described herein, in any suitable order, and the method of uploading or downloading such, and a system including server/s and/or client/s for using such; and hardware which performs any or all of the steps of any of the methods shown and described herein, in any suitable order, either alone or in conjunction with software.

Features of the present invention which are described in the context of separate embodiments may also be provided in combination in a single embodiment. Conversely, features of the invention, including method steps, which are described for brevity in the context of a single embodiment or in a certain order may be provided separately or in any suitable subcombination or in a different order. "e.g." is used herein in the sense of a specific example which is not intended to be limiting.

The invention claimed is:

1. An apparatus that has Chien search capabilities, the apparatus comprising: a first hardware circuit to evaluate an error locator polynomial for a first element of a finite field over which the error locator polynomial is defined, and to provide a first set of intermediate results and a first Chien search result; and a second hardware circuit, wherein the first hardware circuit is to provide the first set of intermediate results to the second hardware circuit, and wherein the second hardware circuit is to evaluate the error locator polynomial for a second element of the finite field to provide a second Chien search result in response to the first set of intermediate results; wherein the first hardware circuit comprises a mask and add unit to sum unmasked bits representative of preliminary results obtained during an evaluation of the error locator polynomial to provide the first set of intermediate results.

2. An apparatus that has Chien search capabilities, the apparatus comprising: a first hardware circuit to evaluate an error locator polynomial for a first element of a finite field over which the error locator polynomial is defined, and to provide a first set of intermediate results and a first Chien search result; and a second hardware circuit, wherein the first hardware circuit is to provide the first set of intermediate results to the second hardware circuit, and wherein the second hardware circuit is to evaluate the error locator polynomial for a second element of the finite field to provide a second Chien search result in response to the first set of intermediate results; wherein the first hardware circuit comprises a shift and add unit to shift the first set of intermediate results by different shift factors to provide shifted results and adds the shifted results to provide a first shifted sum.

3. The apparatus according to claim 2, wherein the first hardware circuit comprises a modulo circuit to perform a modulo operation on the first shifter sum to provide the first Chien search result.

4. The apparatus according to claim 2, wherein the first hardware circuit further comprises a mask and add unit to sum unmasked bits representative of preliminary results obtained during an evaluation of the error locator polynomial to provide the first set of intermediate results.

5. An apparatus that has Chien search capabilities, the apparatus comprising: a first hardware circuit to evaluate an error locator polynomial for a first element of a finite field over which the error locator polynomial is defined, and to provide a first set of intermediate results and a first Chien search result; and a second hardware circuit, wherein the first hardware circuit is to provide the first set of intermediate results to the second hardware circuit, and wherein the second hardware circuit is to evaluate the error locator polynomial for a second element of the finite field to provide a second Chien search result in response to the first set of intermediate results; wherein the second hardware circuit comprises a squaring circuit to square the first set of intermediate results to provide a second set of intermediate results.

6. The apparatus according to claim 5, wherein the second hardware circuit comprises a shift and add unit to shift the second set of intermediate results by different shift factors to provide shifted results and adds the shifted results to provide a second shifted sum.

7. The apparatus according to claim 6, wherein the second hardware circuit comprises a modulo circuit to perform a modulo operation on the second shifted sum to provide the second Chien search result.

8. An apparatus that has Chien search capabilities, the apparatus comprising: a first hardware circuit to evaluate an error locator polynomial for a first element of a finite field over which the error locator polynomial is defined, and to provide a first set of intermediate results and a first Chien search result; and a second hardware circuit, wherein the first hardware circuit is to provide the first set of intermediate results to the second hardware circuit, and wherein the second hardware circuit is to evaluate the error locator polynomial for a second element of the finite field to provide a second Chien search result in response to the first set of intermediate results; comprising a third hardware circuit to evaluate the error locator polynomial for a third element of the finite field to provide a third Chien search result in response to a second set of intermediate results generated by the second hardware circuit.

9. An apparatus that has Chien search capabilities, the apparatus comprising multiple hardware circuits, the multiple hardware circuits comprise: a first hardware circuit to evaluate an error locator polynomial for a first element of a finite field over which the error locator polynomial is defined, and to provide a first set of intermediate results and a first Chien search result; and a second hardware circuit, wherein the first hardware circuit is to provide the first set of intermediate results to the second hardware circuit, and wherein the second hardware circuit is to evaluate the error locator polynomial for a second element of the finite field to provide a second Chien search result in response to the first set of intermediate results; wherein each hardware circuit of the multiple hardware circuits evaluates the error locator polynomial for a different element of the finite field, wherein each of the multiple hardware circuits is to perform a modulo operation only at a modulo circuit that provides a Chien search result.

10. The apparatus according to claim 9, wherein each hardware circuit comprises a mask and add unit to sum unmasked bits representative of preliminary results obtained during an evaluation of the error location polynomial.

11. A method for providing Chien search results comprising: evaluating, by a first hardware circuit, an error locator polynomial for a first element of a finite field over which the error locator polynomial is defined to provide a first set of intermediate results and a first Chien search result; providing the first set of intermediate results to a second hardware circuit; evaluating, by the second hardware circuit, the error locator polynomial for a second element of the finite field to provide a second Chien search result in response to the first set of intermediate results; masking bits representative of preliminary results obtained during an evaluation of the error location polynomial; and summing unmasked bits representative of the preliminary results to provide the first set of intermediate results.

12. A method for providing Chien search results comprising: evaluating, by a first hardware circuit, an error locator polynomial for a first element of a finite field over which the error locator polynomial is defined to provide a first set of intermediate results and a first Chien search result; providing the first set of intermediate results to a second hardware circuit; evaluating, by the second hardware circuit, the error locator polynomial for a second element of the finite field to provide a second Chien search result in response to the first set of intermediate results; shifting the first set of intermediate results by different shift factors to provide shifted results; and adding the shifted results to provide a first shifted sum.

13. The method according to claim 12, comprising performing a modulo operation on the first shifted sum to provide the first Chien search result.

14. The method according to claim 12, comprising: masking bits representative of preliminary results obtained during an evaluation of the error location polynomial; and summing unmasked bits representative of the preliminary results to provide the first set of intermediate results.

15. A method for providing Chien search results comprising: evaluating, by a first hardware circuit an error locator polynomial for a first element of a finite field over which the error locator polynomial is defined to provide a first set of intermediate results and a first Chien search result; providing the first set of intermediate results to a second hardware circuit; evaluating, by the second hardware circuit, the error locator polynomial for a second element of the finite field to provide a second Chien search result in response to the first set of intermediate results; and squaring the first set of intermediate results to provide a second set of intermediate results.

16. The method according to claim 15, comprising: shifting the second set of intermediate results by different shift factors to provide shifted results; and adding the shifted results to provide a second shifted sum.

17. The method according to claim 16, comprising performing a modulo operation on the second shifted sum to provide the second Chien search result.

18. A method for providing Chien search results comprising: evaluating, by a first hardware circuit, an error locator polynomial for a first element of a finite field over which the error locator polynomial is defined to provide a first set of intermediate results and a first Chien search result; providing the first set of intermediate results to a second hardware circuit; evaluating, by the second hardware circuit, the error locator polynomial for a second element of the finite field to provide a second Chien search result in response to the first set of intermediate results; and evaluating, by a third hardware circuit, the error locator polynomial for a third element of the finite field to provide a third Chien search result in response to a second set of intermediate results generated by the second hardware circuit.

19. A method for providing Chien search results comprising: evaluating, by a first hardware circuit, an error locator polynomial for a first element of a finite field over which the error locator polynomial is defined to provide a first set of intermediate results and a first Chien search result; providing the first set of intermediate results to a second hardware circuit; evaluating, by the second hardware circuit, the error locator polynomial for a second element of the finite field to provide a second Chien search result in response to the first set of intermediate results; and evaluating the error locator polynomial for different elements of the finite field, wherein each evaluation comprises applying modulo operation only at a last stage of the evaluating.

20. The method according to claim 19, comprising: masking bits representative of preliminary results obtained during an evaluation of the error location polynomial; and summing unmasked bits representative of the preliminary results to provide the first set of intermediate results.

* * * * *